United States Patent [19]

Shu et al.

[11] Patent Number: 5,576,654
[45] Date of Patent: Nov. 19, 1996

[54] BIMOS DRIVER CIRCUIT AND METHOD

[75] Inventors: Tzi-Hsiung Shu, Melbourne; Kantilal Bacrania, Palm Bay, both of Fla.

[73] Assignee: Harris Corporation, Melbourne, Fla.

[21] Appl. No.: 441,726

[22] Filed: May 16, 1995

[51] Int. Cl.⁶ .......................... H03K 17/60; H03K 17/687
[52] U.S. Cl. .......................... 327/433; 327/112; 327/323; 327/374; 327/392
[58] Field of Search ................................. 327/108, 111, 327/112, 374, 375, 376, 377, 383, 323, 392, 579, 585, 433, 312, 327, 328, 432

[56] References Cited

U.S. PATENT DOCUMENTS

| | | | |
|---|---|---|---|
| 4,021,684 | 5/1977 | Macey | 327/579 |
| 4,081,695 | 3/1978 | Allen et al. | 327/579 |
| 4,159,450 | 6/1979 | Hoover. | |
| 4,347,445 | 8/1982 | Baker | 327/433 |
| 4,503,342 | 3/1985 | Adam. | |
| 4,616,146 | 10/1986 | Lee et al. | |
| 4,682,054 | 7/1987 | McLaughlin. | |
| 4,719,373 | 1/1988 | Masuda et al. | 327/433 |
| 4,871,928 | 10/1989 | Bushey. | |
| 5,334,883 | 8/1994 | Rosenthal | 327/108 |
| 5,338,987 | 8/1994 | Tomasetti et al. | |
| 5,438,287 | 8/1995 | Faue | 327/312 |

*Primary Examiner*—Timothy P. Callahan
*Assistant Examiner*—My-Trang Nu Ton
*Attorney, Agent, or Firm*—Rogers & Killeen

[57] ABSTRACT

A BIMOS driver circuit and method in which a push-pull pair of PNP-NPN bipolar transistors replaces the middle CMOS inverter stages in a circuit for driving a capacitive load. The rise and fall times of the circuit are made symmetrical by feeding back driver circuit output to operate a feedback transistor which removes the base charge stored in a PNP transistor of the bipolar push-pull pair, and maintains low propagation delay.

20 Claims, 2 Drawing Sheets

BIMOS DRIVER CIRCUIT AND METHOD

BACKGROUND OF THE INVENTION

The present invention is directed to circuits and methods of driving capacitive loads, and more particularly to an improved method and BIMOS driver circuit having CMOS inverters and a PNP-NPN bipolar push-pull pair in which the speed of the output driver pair is increased maintaining good symmetry and minimizing propagation delay.

Conventional driver circuits for driving large capacitive loads, such as in a clock generator circuit for an analog to digital converter, have cascaded plural CMOS inverters $I_1 \ldots I_n$, such as illustrated in FIG. 1, that are scaled by a factor $\alpha$ (where $\alpha \cong e$) for each additional inverter stage to increase the drive capability and to minimize circuit output rise and fall time and propagation delay. This arrangement was driven by the limited drive capability of a CMOS inverter, and consequently several inverter stages were needed to drive large loads. Each inverter, when switching between high and low states, charges and discharges its loading capacitance and draws and dumps current from and to the power supply lines. As a result, the conventional multiple stage driver consumes large amounts of real estate in an integrated circuit, and draws higher transient peak current when the driver is switching. Higher transient peaks (especially in the ground supply line) increase circuit noise.

A further disadvantage is that circuit propagation delay is directly related to the number of inverter stages and may vary widely with temperature. A uniform delay is especially useful in the design of a clock circuit that may have different loadings on different clock phases that require tracking.

With reference now to FIG. 2, BIMOS driver circuits of the prior art were improved by reducing the number of inverter stages. Some of the stages were replaced by a push-pull device having a pair of NPN-PNP bipolar transistors. For example, a driver circuit may include an input CMOS inverter 10 having a pair of CMOS devices, a push-pull bipolar transistor pair 12, and a second inverter 14 having a pair of CMOS devices. Push-pull pair 12 is used to provide a large current to drive a heavy load but cannot swing the driver circuit output rail-to-rail, and the second inverter 14 is used to provide rail-to-rail output swing after the push-pull pair 12 reaches its limit. However, when the circuit of FIG. 2 is driving a large load, the fall time is limited by the current gain of the PNP transistor Q1 in push-pull pair 12, and thus the rise and fall times become asymmetrical, where the amount of asymmetry is determined, at least in part, by the load condition. This arrangement makes matching of propagation delay difficult when multiple signal paths with different loading conditions are encountered, and may require different size components and inconsistent circuit topology for diverse applications. Further, the input signal $V_{in}$ is additionally loaded because it drives both first inverter 10 and second inverter 14.

A further disadvantage of the circuit of FIG. 2 is that input signal $V_{in}$ is inverted when it is output as $V_{out}$ (that is, if the state of $V_{in}$ is low, the state of $V_{out}$ is high.) A further inverter would be required to re-invert the state of $V_{out}$.

Accordingly, it is an object of the present invention to provide a novel driver circuit and method for driving a capacitive load that obviates the problems of the prior art by reducing or eliminating the asymmetry caused by the PNP transistor.

It is another object of the present invention to provide a novel driver circuit and method in which the rise and fall time of the circuit are made symmetrical by feeding back driver circuit output to operate a feedback device which removes a base charge stored in the PNP transistor of a push-pull pair of PNP-NPN bipolar transistors.

It is yet another object of the present invention to provide a novel driver circuit and method in which a circuit input voltage drives a first inverter, which in turn drives a push-pull transistor pair, which in turn drives a second inverter that provides a circuit output, and where the three components are connected in parallel between a power supply and a reference voltage, so that the input voltage is not driving the second inverter.

It is still another object of the present invention to provide a novel driver circuit and method in which a first inverter, a push-pull device driven by the first inverter, and a second inverter driven by the push-pull device are connected in parallel between a power supply and a reference voltage, and in which an output from the second inverter is fed back to the base of the PNP transistor in the push-pull device to remove a base charge stored therein, thereby increasing the speed of the output from the push-pull device and reducing asymmetry in rise and fall times.

It is a further object of the present invention to provide a novel three stage driver circuit and method in which the input signal is not inverted at the output.

It is yet a further object of the present invention to provide a novel driver circuit and method in which the configuration of the circuit includes three stages regardless of application, thereby maintaining minimum propagation delay while maintaining circuit topology.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
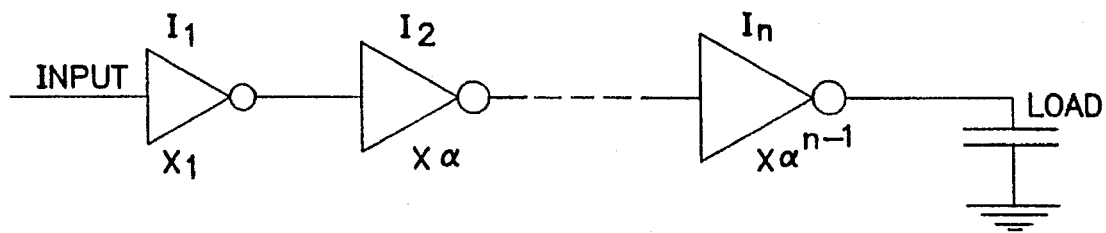
FIG. 1 is a schematic diagram of cascaded inverters in prior art driver circuits.
Figure 2:
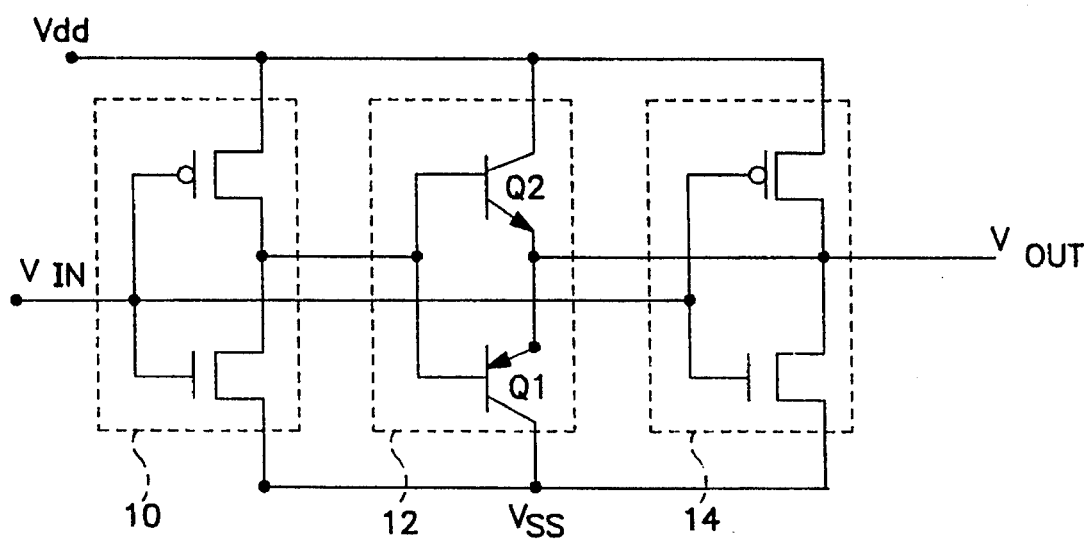
FIG. 2 is a circuit diagram of a BIMOS driver circuit of the prior art.
Figure 3:
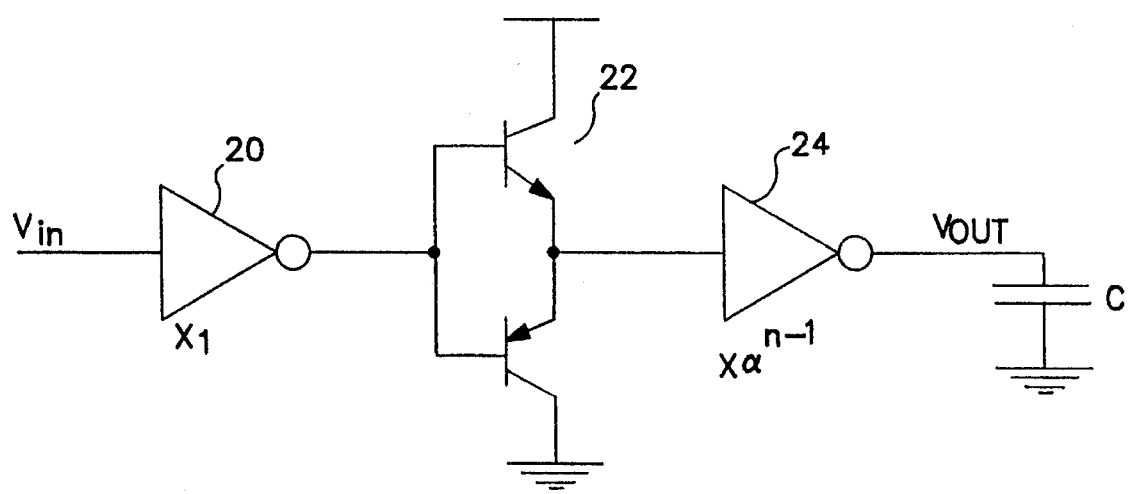
FIG. 3 is a schematic diagram of an embodiment of a driver circuit of the present invention.

With reference now to FIG. 3, an embodiment of the BIMOS driver circuit of the present invention may include an input inverter 20 driven by the input voltage $V_{in}$, a push-pull bipolar transistor pair 22 driven by an output from the input inverter 20, and an output inverter 24 for maintaining rail-to-rail output signal level that is driven by an output from the push-pull pair 22. Push-pull pair 22 replaces the intermediate inverter stages of FIG. 1, and in contrast to the improvement of FIG. 2 is connected to drive output inverter 24 so that $V_{in}$ drives only input inverter 20. Output inverter 24 may be the same as the last inverter stage of FIG. 1 in order to maintain rail-to-rail output signal level. An output voltage $V_{out}$ from output inverter 24 drives a capacitive load C.

Figure 4:
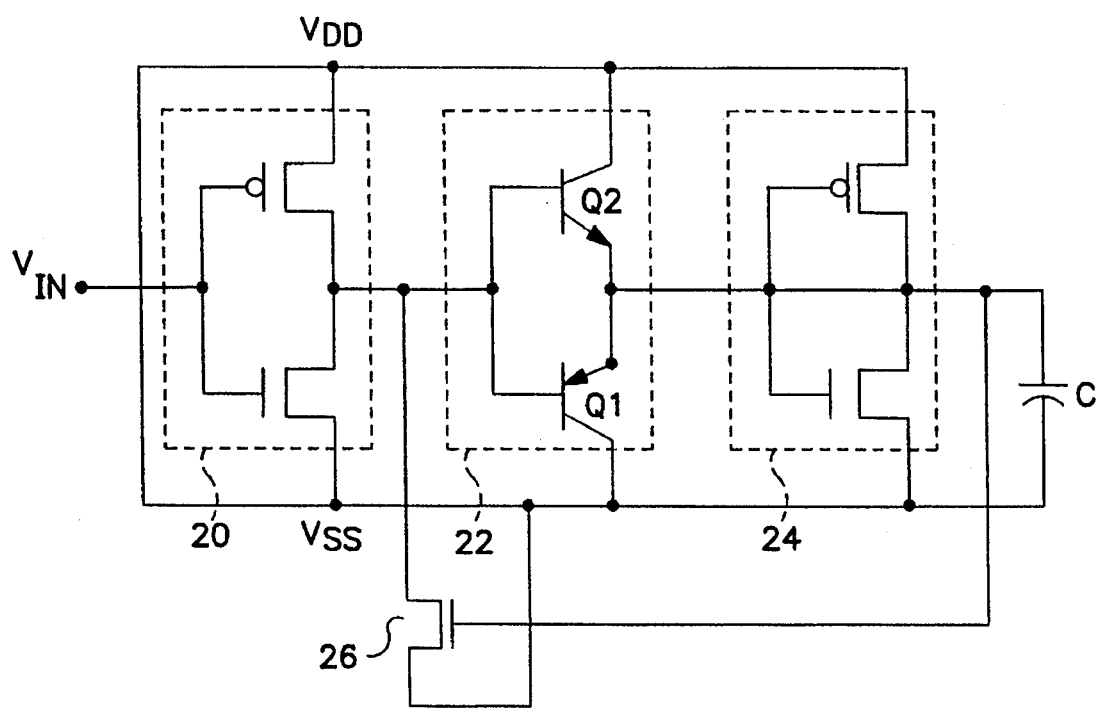
FIG. 4 is a circuit diagram of an embodiment of a BIMOS driver circuit of the present invention.

With reference now to FIG. 4, a preferred embodiment of the present invention may include a feedback device 26 for improving the output of push-pull pair 22 by helping to remove the base charge stored in PNP transistor Q1. When the base charge is removed, the fall time of the circuit is not limited by the low current gain of PNP transistor Q1, the rise and fall times may be symmetrical, or more nearly so. Feedback device 26 may be a transistor with a control terminal connected to an output from the driver circuit, and with connections to the base of PNP transistor Q1 and a reference voltage $V_{ss}$ (such as ground). In a preferred embodiment the feedback device 26 is an N-channel FET. The rise and fall time of the output from the circuit may be determined by the sizes of the CMOS devices in output inverter 24, and which can be scaled easily to match propagation delay.

In the preferred embodiment of FIG. 4, input inverter 20, push-pull pair 22, and output inverter 24 are connected in parallel between a power supply $V_{DD}$ and $V_{ss}$. As in FIG. 3, $V_{in}$ drives only input inverter 20.

In a further embodiment where the output signal level is not required to be rail-to-rail, output inverter 24 may be deleted and the driver circuit output may be provided directly from pushpull pair 22.

The above-described embodiment includes removal of the base charge from the PNP transistor because the PNP transistor is typically slower than the NPN transistor. In a further embodiment in which the NPN transistor is slower than the PNP transistor (for example, when a different substrate is used), the circuit of FIG. 4 may be changed so that it is the opposite of that shown. Feedback device 26 may be a P-channel FET connected to $V_{DD}$ instead of to $V_{ss}$.

As will be appreciated, as compared to the prior art the circuits herein may decrease consumed area, reduce propagation delay through the driver circuit, decrease transient current peaks that increase noise, reduce delay time variation over temperature and manufacturing process, and improve delay time symmetry for different loads. For example, test results have shown a twenty percent improvement in transient peak current in the $V_{DD}$ supply line.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A BIMOS driver circuit comprising:
   a first inverter connected to the BIMOS driver circuit input voltage for being driven thereby;
   a push-pull device comprising a pair of PNP and NPN bipolar transistors having bases connected to an output from said first inverter for being driven thereby;
   a second inverter connected to an output from said push-pull device for being driven thereby, an output from said second inverter being connected to a capacitive load driven by the BIMOS driver circuit; and
   a feedback transistor having its control terminal connected to the output from said second inverter for being driven thereby, said feedback transistor being further connected to a base of a slower one of said PNP and NPN transistors of said push-pull device and to one of a power supply and a reference voltage for removing a base charge in said slower transistor.

2. The circuit of claim 1 wherein said first inverter, said push-pull device, and said second inverter are connected in parallel between the power supply and the reference voltage, and wherein said slower transistor is said PNP transistor and the further connection of said feedback transistor is to the reference voltage.

3. The circuit of claim 1 wherein said first inverter, said push-pull device, and said second inverter are connected in parallel between the power supply and the reference voltage, and wherein said slower transistor is said NPN transistor and the further connection of said feedback transistor is to the power supply.

4. The circuit of claim 1 wherein said first inverter comprises a pair of CMOS devices having gates connected to the BIMOS driver circuit input voltage for being driven thereby.

5. The circuit of claim 1 wherein said second inverter comprises a pair of CMOS devices having gates connected to an output from said push-pull device for being driven thereby.

6. A BIMOS driver circuit comprising a first inverter driven by an input voltage for the driver circuit, a push-pull device with a pair of PNP and NPN bipolar transistors for providing an output from the driver circuit, said first inverter and said push-pull device being connected in parallel between a power supply and a reference voltage, and further comprising a feedback transistor having a control terminal driven by the output from the driver circuit and one of its operating terminals connected to a base of a slower one of said PNP and NPN transistors for removing a base charge therefrom.

7. The circuit of claim 6 wherein said feedback transistor comprises a FET having a gate connected to the output from the driver circuit and said slower transistor is said PNP transistor, and wherein the other of the operating terminals of said feedback transistor is connected to the reference voltage.

8. The circuit of claim 6 wherein an output from said first inverter is connected to bases of said pair of PNP and NPN transistors in said push-pull device for operating said push-pull device.

9. The circuit of claim 8 wherein said first inverter comprises a pair of CMOS devices having gates connected to the driver circuit input voltage for being driven thereby.

10. The circuit of claim 9 further comprising a second inverter with a pair of CMOS devices having gates connected to the output from said push-pull device for being driven thereby.

11. The circuit of claim 6 wherein the driver circuit output has a state that is the same as a state of the driver circuit input.

12. A BIMOS driver circuit comprising:
    a first inverter connected to the BIMOS driver circuit input voltage for being driven thereby;
    a push-pull device comprising a pair of PNP and NPN bipolar transistors having bases connected to an output from said first inverter for being driven thereby, an output from said push-pull device being connected to a capacitive load driven by the BIMOS driver circuit; and
    a feedback field effect transistor with its gate connected to the output from said push-pull device for being driven thereby, said feedback transistor having one of its drain and source further connected to a base of a slower one of said PNP and NPN transistors of said push-pull device for removing a base charge in said slower transistor.

13. A method of driving a capacitive load with a BIMOS driver circuit having a first inverter driven by an input voltage for the driver circuit, a push-pull device with a pair of PNP and NPN bipolar transistors, and a second inverter for providing an output for driving the capacitive load, where the first and second inverters and the push-pull device are connected in parallel between a power supply and a reference voltage, the method comprising the steps of:

(a) providing a feedback transistor for removing a base charge from a slower one of the PNP and NPN transistors to improve a speed of an output of the push-pull device;

(b) connecting a control terminal of the feedback transistor to the output from the driver circuit; and (c) connecting one of an input and an output of the feedback transistor to an input to the push-pull device, and connecting the other of the input and the output to the reference voltage when the PNP transistor is slower and to the power supply when the NPN transistor is slower.

14. The method of claim 13 wherein the feedback transistor is a FET having a gate connected to the output from the driver circuit and one of a source and a drain connected to a base of the slower transistor of the push-pull device.

15. The method of claim 14 where the FET is an N-channel FET when the PNP transistor is the slower transistor.

16. The method of claim 14 where the FET is a P-channel FET when the NPN transistor is the slower transistor.

17. The method of claim 13 further comprising the steps of connecting an output from the first inverter to bases of the pair of PNP and NPN transistors in the push-pull device for operating the push-pull device, and connecting an output from the push-pull device to the second inverter for operating the second inverter.

18. The method of claim 17 where the first inverter comprises a pair of CMOS devices having gates connected to the driver circuit input voltage for being driven thereby.

19. The method of claim 18 where the second inverter comprises a pair of CMOS devices having gates connected to an output from the push-pull device for being driven thereby.

20. A method of driving a capacitive load with a BIMOS driver circuit having an inverter driven by an input voltage for the driver circuit, a push-pull device with a pair of PNP and NPN bipolar transistors, and an output for driving the capacitive load, where the inverter and the push-pull device are connected in parallel between a power supply and a reference voltage, the method comprising the steps of:

(a) providing a feedback field effect transistor (FET) for removing a base charge from a slower one of the PNP and NPN transistors to improve a speed of an output of the push-pull device;

(b) connecting a gate of the feedback FET to the output from the driver circuit; and (c) connecting one of a source and a drain of the feedback FET to an input to the push-pull device, and connecting the other of the input and the output to the reference voltage when the PNP transistor is slower and to the power supply when the NPN transistor is slower.

* * * * *